United States Patent
Aga

(10) Patent No.: US 12,438,479 B2
(45) Date of Patent: Oct. 7, 2025

(54) PIEZOELECTRIC ACTUATOR AND OPTICAL SCANNING APPARATUS

(71) Applicant: Hisanori Aga, Tokyo (JP)

(72) Inventor: Hisanori Aga, Tokyo (JP)

(73) Assignee: MITSUMI ELECTRIC CO., LTD., Tokyo (JP)

(*) Notice: Subject to any disclaimer, the term of this patent is extended or adjusted under 35 U.S.C. 154(b) by 1036 days.

(21) Appl. No.: 17/004,273

(22) Filed: Aug. 27, 2020

(65) Prior Publication Data

US 2021/0083599 A1    Mar. 18, 2021

(30) Foreign Application Priority Data

Sep. 12, 2019    (JP) ................... 2019-165949

(51) Int. Cl.
| | |
|---|---|
| H02N 2/02 | (2006.01) |
| G02B 26/08 | (2006.01) |
| H01L 41/047 | (2006.01) |
| H01L 41/187 | (2006.01) |
| H10N 30/00 | (2023.01) |
| H10N 30/50 | (2023.01) |
| H10N 30/853 | (2023.01) |
| H10N 30/87 | (2023.01) |

(52) U.S. Cl.
CPC ............ *H02N 2/028* (2013.01); *H10N 30/50* (2023.02); *H10N 30/704* (2024.05); *H10N 30/8548* (2023.02); *H10N 30/8554* (2023.02); *H10N 30/878* (2023.02); *G02B 26/0858* (2013.01)

(58) Field of Classification Search
CPC ...... H02N 2/028; H10N 30/50; H10N 30/878; H10N 30/1051; H10N 30/8548; H10N 30/8554; G02B 26/0858

USPC ........................................................ 310/311
See application file for complete search history.

(56) References Cited

U.S. PATENT DOCUMENTS

| | | | | |
|---|---|---|---|---|
| 6,194,818 | B1 * | 2/2001 | Sumi ................... | H10N 30/078 310/311 |
| 7,083,869 | B2 * | 8/2006 | Liu ....................... | G02F 1/0316 252/62.9 PZ |
| 2014/0085694 | A1 * | 3/2014 | Aga ...................... | H10N 30/877 310/366 |
| 2015/0132529 | A1 * | 5/2015 | Watanabe ............. | C04B 35/64 252/62.9 PZ |
| 2015/0298161 | A1 * | 10/2015 | Beeckman .......... | H01L 21/02282 427/430.1 |
| 2017/0262022 | A1 * | 9/2017 | Choi ..................... | G06F 1/1652 |

FOREIGN PATENT DOCUMENTS

| | | | |
|---|---|---|---|
| JP | 2005-340428 | 12/2005 | |
| JP | 4058018 B2 * | 3/2008 | .......... B41J 2/14233 |
| JP | 2015-115355 | 6/2015 | |
| JP | 2016-046335 | 4/2016 | |

OTHER PUBLICATIONS

Office Action mailed on Jun. 20, 2023 with respect to the corresponding Japanese application No. 2019-165949.

* cited by examiner

*Primary Examiner* — Emily P Pham
*Assistant Examiner* — Monica Mata
(74) *Attorney, Agent, or Firm* — IPUSA, PLLC

(57) ABSTRACT

A piezoelectric actuator includes a substrate, and a drive structure formed on the substrate, wherein the drive structure includes a piezoelectric thin film, and an average grain size of the piezoelectric thin film is smaller than or equal to 1 μm.

8 Claims, 6 Drawing Sheets

PIEZOELECTRIC ACTUATOR AND OPTICAL SCANNING APPARATUS

CROSS-REFERENCE TO RELATED APPLICATIONS

This application is based on and claims priority to Japanese Patent Application No. 2019-165949, filed Sep. 12, 2019, the entire contents of which are incorporated herein by reference.

BACKGROUND OF THE INVENTION

1. Field of the Invention

The present disclosure relates to a piezoelectric actuator and an optical scanning apparatus.

2. Description of the Related Art

In an optical scanning apparatus that rotates a mirror to scan with light, there are cases in which piezoelectric actuators having piezoelectric thin films are used as drive sources for driving the mirror. Because it is desirable that drive voltage of the piezoelectric actuator is low, studies have been conducted on reducing the drive voltage of the piezoelectric actuator by, for example, forming the piezoelectric thin film from a PZT-based material to increase a piezoelectric constant.

Specifically, for example, an optical scanning apparatus with a piezoelectric actuator in which a piezoelectric thin film is made of a PZT-based material composed of Pb(Mn, Nb)$O_3$, which includes Pb as an A site of a perovskite ferroelectric material, Mn as an acceptor element $B_A$, and Nb as a donor element $B_D$, is proposed.

In the optical scanning apparatus, the film thickness of the piezoelectric thin film is about 2 μm to 10 μm, and the grain size of the piezoelectric thin film is about 1 μm. Resonance drive is used to drive the mirror, and the drive voltage of the piezoelectric actuator is several tens volts (see, for example, Patent Document 1).

RELATED-ART DOCUMENTS

Patent Documents

Patent Document 1: Japanese Laid-open Patent Publication No. 2015-115355

SUMMARY OF THE INVENTION

According to one aspect of the embodiments of the present disclosure, a piezoelectric actuator includes a substrate, and a drive structure formed on the substrate, wherein the drive structure includes a piezoelectric thin film, and an average grain size of the piezoelectric thin film is smaller than or equal to 1 μm.

DESCRIPTION OF THE EMBODIMENTS

Figure 1:
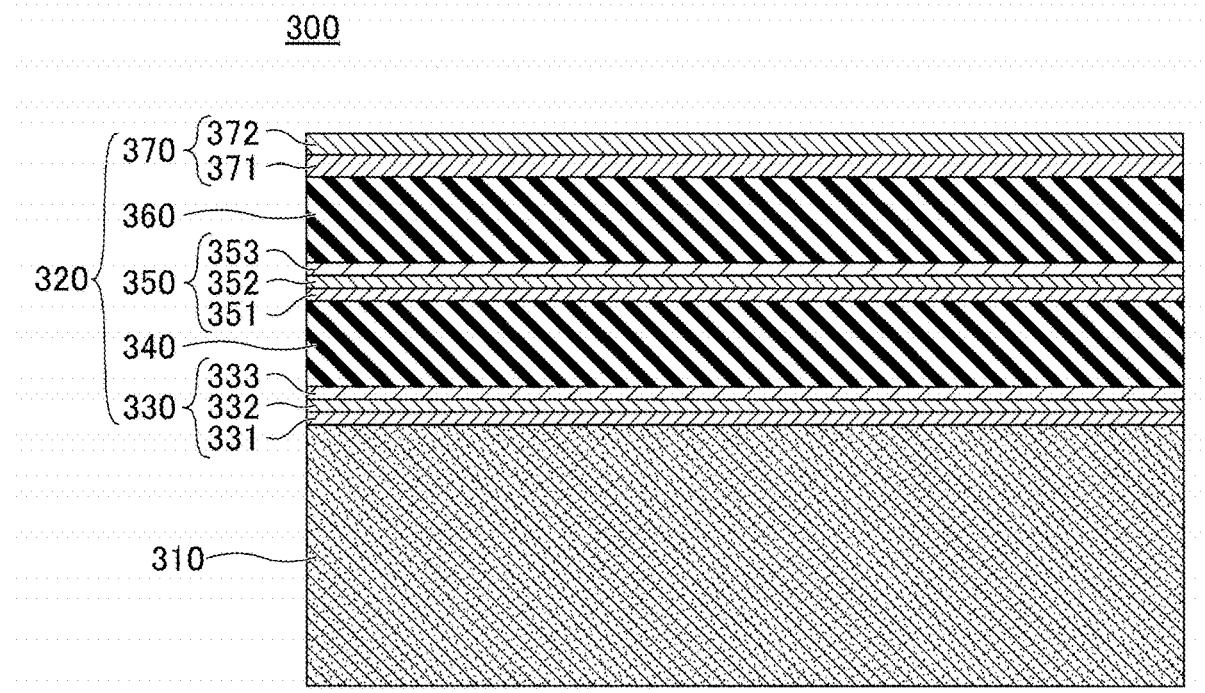
FIG. 1 is a first cross-sectional view illustrating an example of a piezoelectric actuator according to a first embodiment.

In the related art, reduction of the drive voltage of the piezoelectric actuator has not been sufficiently achieved, and further reduction of the drive voltage of the piezoelectric actuator is desired.

The present disclosure is made in view of the description above, it is desirable to reduce the drive voltage of the piezoelectric actuator.

In the following, an embodiment of the disclosure will be described with reference to the drawings. In each drawing, the same components are referenced by the same reference numerals and an overlapping description may be omitted.

First Embodiment

FIG. 1 is a cross-sectional view illustrating an example of a piezoelectric actuator according to a first embodiment. Referring to FIG. 1, a piezoelectric actuator 300 includes a substrate 310 and a drive structure 320 formed on the substrate 310.

The drive structure 320 includes a lower electrode 330 formed on the substrate 310, a piezoelectric thin film 340 formed on the lower electrode 330, an intermediate electrode 350 formed on the piezoelectric thin film 340, a piezoelectric thin film 360 formed on the intermediate electrode 350 and an upper electrode 370 formed on the piezoelectric thin film 360.

In the piezoelectric actuator 300, for example, the intermediate electrode 350 is connected to a ground and a drive signal that drives the piezoelectric actuator 300 is provided to the lower electrode 330 and the upper electrode 370. The drive signal is provided to the lower electrode 330 and the upper electrode 370, so that the piezoelectric actuator 300 is displaced in accordance with the voltage of the drive signal.

The substrate 310 is, for example, a silicon substrate. A silicon oxide film may be formed on a top surface of the silicon substrate, for example. The substrate 310 may be a silicon on insulator (SOI) substrate including a support layer, a buried oxide layer (BOX), and an active layer.

The lower electrode 330 is, for example, a film formed of three layers: a first layer 331, a second layer 332, and a third layer 333.

Each of the first 331 and third 333 layers is preferably a conductive oxide film having a perovskite structure and (110) orientation. Examples of the conductive oxide film having the perovskite structure and the (110) orientation include a lanthanum nickel oxide LaNiO$_3$ (LNO) thin film, a strontium ruthenate SrRuOx (SRO) thin film, and a barium ruthenate BaRuO$_3$ (BRO) thin film. The film thickness of each of the first 331 and third 333 layers is 30 nm, for example.

The second layer 332 is a Pt thin film, for example. The second layer 332 may be a thin film of a platinum group other than Pt, such as an Ir thin film and an Os thin film. The film thickness of the second layer 332 is 150 nm, for example.

The intermediate electrode 350 is, for example, a film formed of three layers: a first layer 351, a second layer 352, and a third layer 353.

Each of the first layer 351 and third layer 353 is preferably a conductive oxide film having the perovskite structure and the (110) orientation. Specific materials are similar to the materials exemplified for the first layer 331 and the third layer 333. The film thickness of each of the first layer 351 and the third layer 353 is 80 nm, for example.

The second layer 352 is a Pt thin film, for example. The second layer 352 may be a thin film of the platinum group other than Pt, such as an Ir thin film and an Os thin film. The film thickness of the second layer 352 is 150 nm, for example.

The upper electrode 370 is, for example, a film formed of two layers of a first layer 371 and a second layer 372.

The first layer 371 is preferably a conductive oxide film having the perovskite structure and the (110) orientation. Specific materials are similar to the materials exemplified for the first layer 331 and the third layer 333. The film thickness of the first layer 371 is 80 nm, for example.

The second layer 372 is a Pt thin film, for example. The second layer 372 may be a thin film of the platinum group other than Pt, such as an Ir thin film and an Os thin film. The film thickness of the second layer 372 is 100 nm, for example.

The first layer 351 of the intermediate electrode 350 and the first layer 371 of the upper electrode 370 inhibit degradation of the piezoelectric thin films 340 and 360, which are respectively under the first layer 351 of the intermediate electrode 350 and the first layer 371 of the upper electrode 370.

The film thickness of the first layer 331 and the third layer 333 of the lower electrode 330, the film thickness of the first layer 351 and the third layer 353 of the intermediate electrode 350, and the film thickness of the first layer 371 of the upper electrode 370 each are preferably greater than or equal to 30 nm. By causing the film thickness of these films to be greater than or equal to 30 nm, the LNO thin film can be uniformly formed.

The average grain size of the third layer 333 of the lower electrode 330 and the average grain size of the third layer 353 of the intermediate electrode 350 are preferably smaller than or equal to 35 nm and are more preferably smaller than or equal to 25 nm.

If the average grain size of the third layer 333 of the lower electrode 330 is within the range described above, the average grain size of the piezoelectric thin film 340, which is disposed over the third layer 333 of the lower electrode 330, can be reduced. If the average grain size of the third layer 353 of the intermediate electrode 350 is within the range described above, the average grain size of the piezoelectric thin film 360, which is disposed over the third layer 353 of the intermediate electrode 350, can be reduced. For example, when the piezoelectric actuator 300 is used for an optical scanning apparatus having a mirror, the smaller the average grain size of each of the piezoelectric thin films 340 and 360, the lower the drive voltage for causing the mirror driven by the piezoelectric actuator 300 to move at the same oscillation angle (which will be hereinafter simply referred to as the drive voltage of the piezoelectric actuator 300) is.

Here, the average grain size is an average value of crystal grain sizes in an in-plane horizontal direction of the film of interest. The average grain size can be calculated by analyzing the film of interest with an electron beam diffraction device. The in-plane horizontal direction is a direction horizontal to the upper surface of the lower layer on which the film of interest is formed.

A piezoelectric materials forming the piezoelectric thin films 340 and 360 preferably have the perovskite structure. The piezoelectric thin films 340 and 360 are, for example, lead zirconate titanate (PZT), which has the perovskite structure. The piezoelectric thin film 340 may be formed on the lower electrode 330 and the piezoelectric thin film 360 may be formed on the intermediate electrode 350 by using a sol-gel process, for example.

The piezoelectric material forming the piezoelectric thin films 340 and 360 may be a material other than PZT as long as the material has the perovskite structure, and is, for example, lead niobate zirconate titanate (PNZT), lead lanthanum zirconate titanate (PLZT), lead lanthanum titanate (PLT), lead magnesium niobate (PMN), lead manganate niobate (PMNN), and barium titanate (BaTiO$_3$). By using these piezoelectric materials in the piezoelectric thin films 340 and 360, driving force per unit voltage can be improved.

The average grain size of the piezoelectric thin film 340 and the average grain size of the piezoelectric thin film 360 are preferably smaller than or equal to 1 μm, are more preferably smaller than or equal to 600 nm, and are still more preferably smaller than or equal to 450 nm. As described above, the smaller the average grain size of each of the piezoelectric thin films 340 and 360 is, the lower the drive voltage of the piezoelectric actuator 300 is.

The piezoelectric thin films 340 and 360 can be deposited by sputtering on the lower electrode 330 and the intermediate electrode 350, for example, with the temperature of the substrate 310 being greater than or equal to 500 degrees in order to crystalize the piezoelectric thin films 340 and 360 respectively formed on the lower electrode 330 and the intermediate electrode 350, so that the crystal orientation in the in-plane vertical direction of the third layers 333 and 353 is preferentially oriented to (110). By forming the lower electrode 330 and the intermediate electrode 350 under this condition, a PZT thin film can be crystallized and a good piezoelectric property can be obtained. This can reduce the drive voltage of the piezoelectric actuator 300.

The structure of the piezoelectric actuator 300 is not limited to the example illustrated in FIG. 1. For example, in the piezoelectric actuator 300, the piezoelectric thin film may be at least one layer. In this case, the piezoelectric actuator 300 has a three-layer structure in which the lower electrode and the upper electrode are formed on and under the piezoelectric thin film, and no intermediate electrode is required. Additionally, three or more layers of piezoelectric thin films may be provided. In this case, a required number of piezoelectric thin films and intermediate electrodes are alternately laminated on the lower electrode, and finally, the piezoelectric thin film and the upper electrode are sequentially laminated on an uppermost intermediate electrode.

By providing n layers of piezoelectric thin films, the drive voltage of the piezoelectric actuator 300 can be reduced to 1/n of the drive voltage required for one layer.

Figure 2:
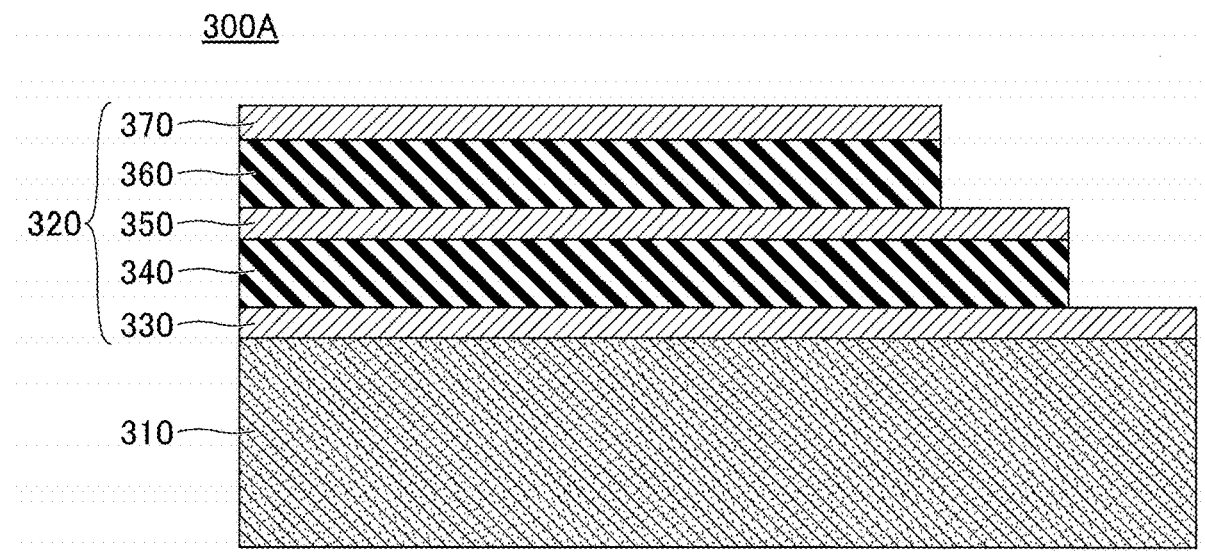
FIG. 2 is a second cross-sectional view illustrating an example of the piezoelectric actuator according to the first embodiment.

As the piezoelectric actuator 300A illustrated in FIG. 2, an end of the lower electrode 330 and an end of the intermediate electrode 350 may be exposed from the upper layers. In FIG. 2, an end of the piezoelectric thin film 340 may be a slope being spread from the intermediate electrode 350 side to the lower electrode 330 side. Similarly, an end of the piezoelectric thin film 360 may be a slope being spread from the upper electrode 370 side to the intermediate electrode 350 side. In the lower electrode 330, the intermediate electrode 350, and the upper electrode 370 of FIG. 2, a laminated structure is not illustrated, but is similar to FIG. 1.

Second Embodiment

In a second embodiment, an example of an optical scanning apparatus using the piezoelectric actuator according to the first embodiment will be described. In the second embodiment, the description of the same configuration unit as the previously described embodiment may be omitted.

Figure 3:
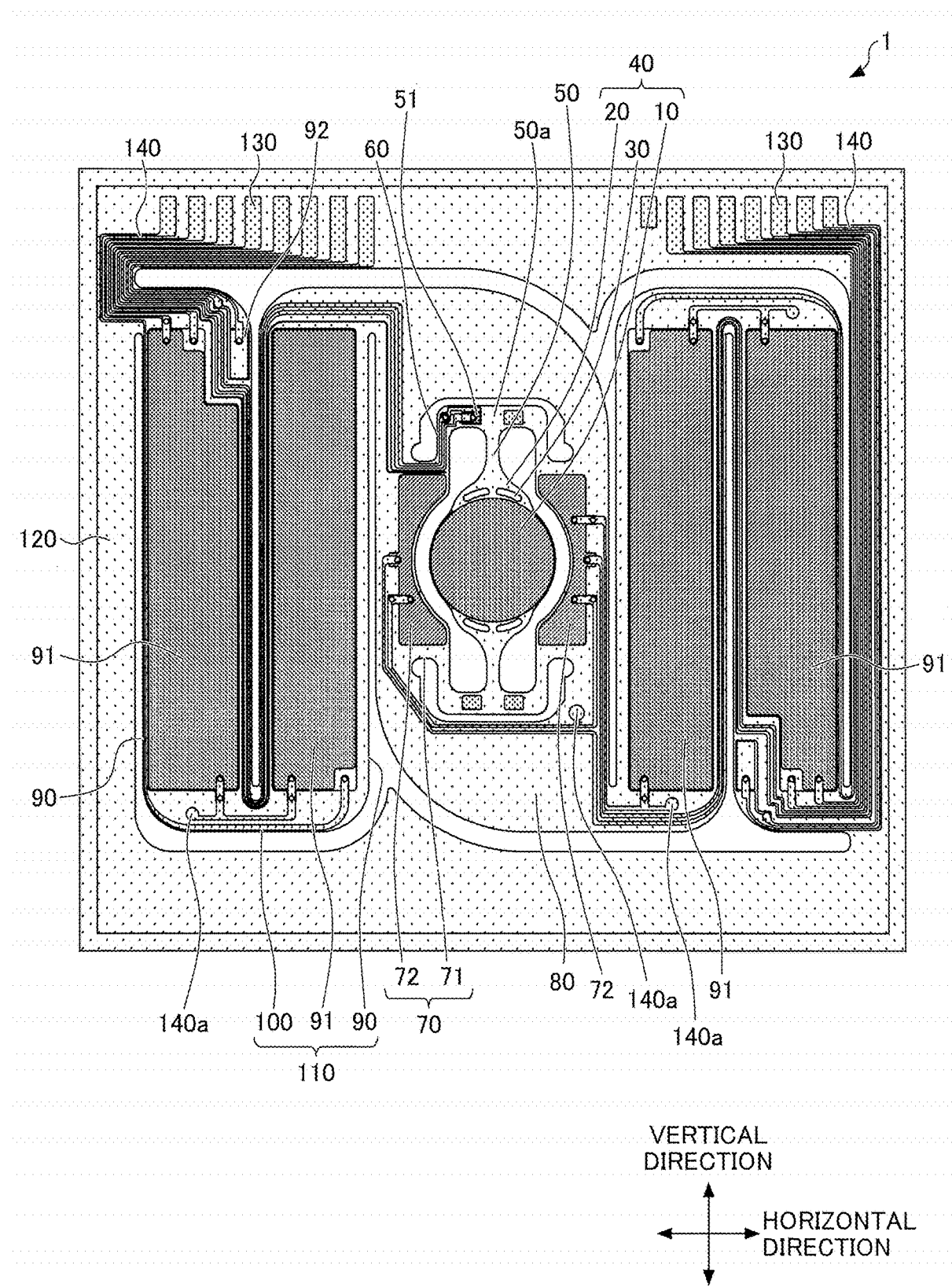
FIG. 3 is a plan view illustrating an example of an optical scanning apparatus according to a second embodiment.

FIG. 3 is a plan view illustrating an example of the optical scanning apparatus according to the second embodiment, and a drawing of the optical scanning apparatus viewed from a mirror reflective surface 10. In FIG. 3, the longitudinal direction of two torsion bars 50 is a vertical direction, and a direction orthogonal to the longitudinal direction of the two torsion bars 50 is a horizontal direction.

Referring to FIG. 3, an optical scanning apparatus 1 is a micro-electro-mechanical system (MEMS) including a mirror 40, the torsion bar 50, a coupling part 60, a horizontal drive part 70, a movable frame 80, a vertical drive part 110, a fixing frame 120, a terminal 130, and a wire 140.

The mirror 40 includes the mirror reflective surface 10 and a stress reduction region 20. The horizontal drive part 70 includes a horizontal drive beam 71 and a drive structure 72. The vertical drive part 110 includes a vertical drive beam 90, a drive structure 91, and a coupling part 100.

The mirror 40 is sandwiched from both sides of the vertical direction by two torsion bars 50 that extend vertically. The mirror 40 includes the mirror reflective surface 10 in the center and includes the stress reduction region 20 between the mirror reflective surface 10 and the torsion bar 50. Two slits 30 are formed in each stress reduction region 20. The torsion bar 50 is coupled to an inner corner of the horizontal drive beam 71 at a base end 50a through the coupling part 60. The horizontal drive beam 71 includes a drive structure 72 on a surface of the horizontal drive beam 71, and an outer edge of the horizontal drive beam 71 is coupled to the movable frame 80. The mirror 40 is driven by the piezoelectric actuator.

The optical scanning apparatus 1 uses the piezoelectric actuator 300 described in the first embodiment as the horizontal drive beam 71 and the drive structure 72. That is, the horizontal drive beam 71 is, for example, a silicon substrate. The drive structure 72 includes the piezoelectric thin films 340 and 360, the lower electrode 330, the intermediate electrode 350, and the upper electrode 370. However, in the piezoelectric actuator 300, the piezoelectric thin film may be formed of at least one layer and may be formed of three or more layers.

A piezoelectric sensor 51 is provided at the base end 50a of the torsion bar 50. The piezoelectric sensor 51 is an oscillation angle sensor for detecting a horizontal oscillation angle of the mirror reflective surface 10 in a state in which the mirror 40 oscillates in the horizontal direction. A piezoelectric element or the like is used for the piezoelectric sensor 51, and, for example, a piezo element is used.

The movable frame 80 supports and surrounds the coupling part 60, the torsion bar 50, and the mirror 40 through the horizontal drive beam 71. The movable frame 80 is coupled to the vertical drive beam 90.

The vertical drive beams 90 are disposed so as to sandwich the movable frame 80 on both sides of the movable frame 80 in the horizontal direction. Multiple vertical drive beams 90 are provided parallel to the torsion bar 50. On each side of the movable frame 80, two vertical drive beams 90 are disposed so as to be adjacent to each other in the horizontal direction. The two adjacent vertical drive beams 90 are coupled by the coupling part 100.

The inner vertical drive beam 90 is coupled to the movable frame 80 at one end and is coupled to the outer vertical drive beam 90 at the other end. The outer vertical drive beam 90 is coupled to the fixing frame 120 at one end and is coupled to the inner vertical drive beam 90 at the other end. The drive structure 91 is provided in the vertical drive beam 90.

The optical scanning apparatus 1 uses the piezoelectric actuator 300 described in the first embodiment as the vertical drive beam 90 and the drive structure 91. That is, the vertical drive beam 90 is, for example, a silicon substrate. The drive structure 91 includes the piezoelectric thin films 340 and 360, the lower electrode 330, the intermediate electrode 350, and the upper electrode 370. However, in the piezoelectric actuator 300, the piezoelectric thin film may be formed of at least one layer and may be formed of three or more layers.

A piezoelectric sensor 92 is provided at one end of the outer vertical drive beam 90. The piezoelectric sensor 92 is an oscillation angle sensor for detecting an oscillation angle of the mirror reflective surface 10 in the vertical direction in a state in which the mirror 40 oscillates in the vertical direction. As in the piezoelectric sensor 51A, a piezoelectric element or the like is used for the piezoelectric sensor 92, and, for example, a piezo element is used.

The fixing frame 120 supports a vertical drive part 110 through the outer vertical drive beam 90. That is, the fixing frame 120 supports the mirror 40 through drive parts (the vertical drive part 110 and the horizontal drive part 70). The fixing frame 120 surrounds the vertical drive part 110 and the movable frame 80 and is rectangular. In the present embodiment, the external shape of the fixing frame 120 is approximately square.

Multiple terminals 130 are provided on a surface of the fixing frame 120. The wire 140 is connected to each terminal 130. The wire 140 is connected to the drive structures 72 and 91, and the piezoelectric sensors 51 and 92. A substrate contact 140a for causing the wire 140 to contact a silicon active layer 303, as a substrate to which a ground potential is applied, is formed on the wire 140.

In the following, each part will be described in more detail.

In the mirror 40, the mirror reflective surface 10, which is approximately circular, is provided in the center. The mirror reflective surface 10 is formed of a highly reflective metal film, such as silver, copper, and aluminum.

The stress reduction region 20 is a spacer provided between the mirror reflective surface 10 and the torsion bar 50 to reduce the torsional stress of the torsion bar 50 and reduce the stress applied to the mirror reflective surface 10. The stress reduction region 20 disperses the stress generated by a torsional movement of the torsion bar 50 and can reduce the stress applied to the mirror reflective surface 10.

The slit 30 is a hole for dispersing the stress applied to the stress reduction region 20 and is provided in the stress reduction region 20.

The torsion bar 50 is a means for supporting the mirror 40 from both sides and for causing the mirror 40 to oscillate in the horizontal direction. Here, the horizontal direction indicates the direction in which the light reflected by the mirror reflective surface 10 scans and moves at a high speed, and indicates a lateral direction of a projection plane. That is, the horizontal direction is the direction in which the mirror reflective surface 10 oscillates in a lateral direction and the torsion bar 50 becomes an axis. The torsion bar 50 alternately twists to the left and right to cause the mirror 40 to oscillate in the horizontal direction.

The coupling part 60 is a means for transmitting driving force in the horizontal direction generated by the horizontal drive beam 71 to the torsion bar 50.

The horizontal drive beam 71 is a drive means for causing the mirror 40 to oscillate in the horizontal direction and causing the light reflected by the mirror reflective surface 10 to scan in the horizontal direction of the projection plane. Voltages of different phases are alternately applied to the two drive structures 72, so that the two horizontal drive beams 71 are alternately curved in opposite directions. This can provide torsional force to the torsion bar 50 to swing the mirror 40 around a horizontal rotation axis parallel to the torsion bar 50.

The drive by horizontal drive beam 71 is, for example, a resonant drive. When the optical scanning apparatus 1 according to the present embodiment is applied to a projector or the like, the mirror 40 is driven by a resonant drive of 30 kHz, for example.

Alternatively, voltages of different phases are applied to the adjacent vertical drive beams 90, so that the movable frame 80 can oscillate in the vertical direction. Since the mirror 40 is supported by the movable frame 80, the mirror 40 oscillates in the vertical direction in accordance with the oscillation of the movable frame 80.

The vertical drive part 110 causes the movable frame 80 to oscillate by using, for example, non-resonant drive. The vertical drive does not require high speed drive compared with horizontal drive, and a drive frequency is about 60 Hz, for example.

The optical scanning apparatus 1 having the above-described configuration is manufactured using, for example, an SOI wafer.

Here, control of the crystal grain size of the piezoelectric thin film in the piezoelectric actuator of the optical scanning apparatus 1 will be described. Conventionally, the crystal grain size of the piezoelectric thin film has not been controlled in piezoelectric actuators. However, the inventor has found that the drive voltage of the piezoelectric actuator can be reduced by controlling the crystal grain size of the piezoelectric thin film so as to reduce the average grain size of the piezoelectric thin film.

Figure 4:
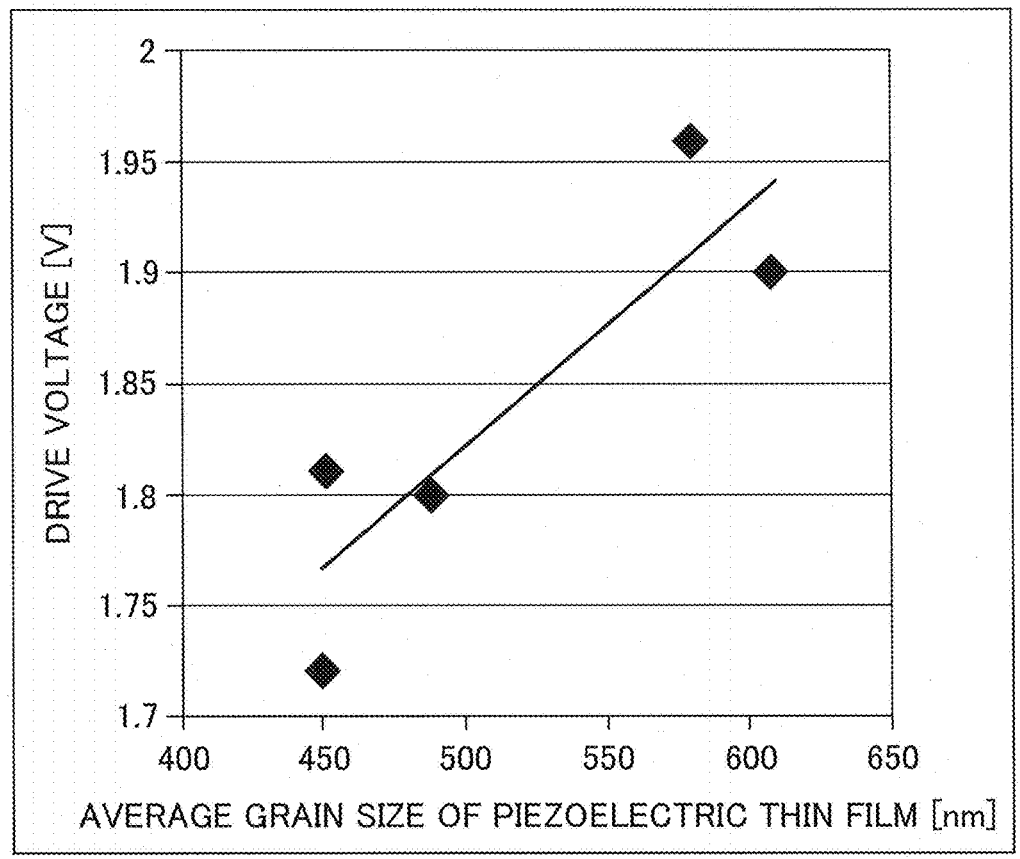
FIG. 4 is a graph illustrating an example of a relation between an average grain size of a piezoelectric thin film and drive voltage.

FIG. 4 is a graph illustrating an example of a relation between the average grain size of the piezoelectric thin film and the drive voltage. In FIG. 4, "the average grain size of the piezoelectric thin film" of the horizontal axis is an average crystal grain size in the in-plane horizontal direction of the piezoelectric thin films 340 and 360 obtained by analyzing cross-sectional photographs of the piezoelectric thin films 340 and 360 with the electron beam diffraction device.

Figure 5:
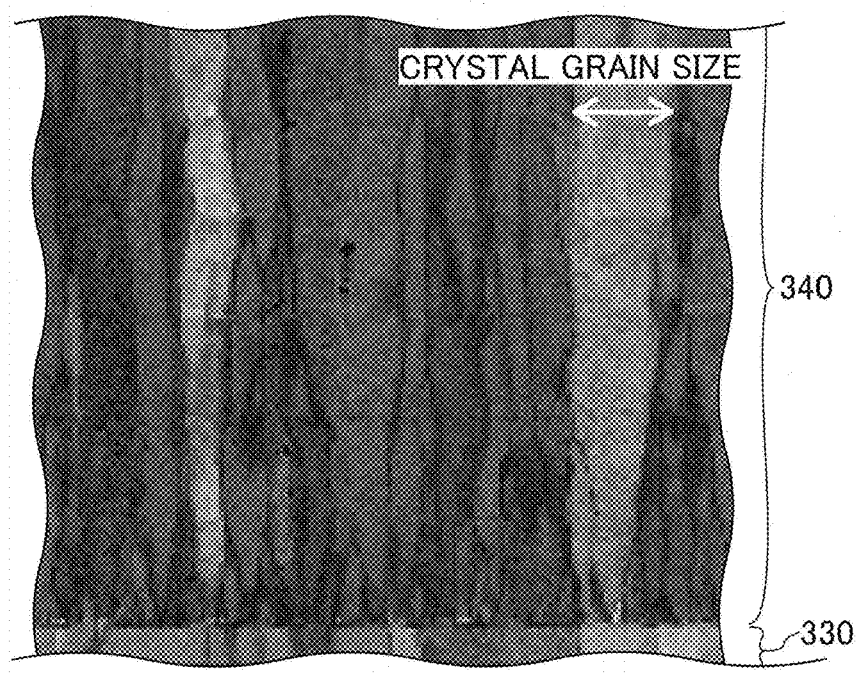
FIG. 5 is a first cross-sectional photograph of a piezoelectric thin film on a lower electrode.

FIG. 5 is a first cross-sectional photograph of the piezoelectric thin film 340 on the lower electrode 330, and a part indicated by an arrow is an example of the crystal grain size in the in-plane horizontal direction of the piezoelectric thin film 340. The average value of the crystal grain size in the in-plane horizontal direction (i.e., the average grain size) is obtained by measuring values of the grain size in the in-plane horizontal direction at respective positions by moving a position of the arrow in the up and down direction and the left and right direction, and averaging the values. In the electron beam diffraction device, cross-sectional photographs of the piezoelectric thin films 340 and 360 are analyzed to obtain the average grain sizes of the piezoelectric thin films 340 and 360.

As the electron beam diffraction device, transmission electron microscope (TEM) based crystal orientation analysis system ASTER (manufactured by NanoMEGAS, registered trademark) can be used. High spatial resolution of about 2 to 5 nm can be achieved using the ASTER.

In FIG. 4, the "drive voltage" of the vertical axis is a voltage that causes the oscillation angle of the mirror 40 to be 3.2 degrees with a configuration in which the intermediate electrode 350 constituting the drive structure 72 is connected to the ground and the drive voltage is supplied between the upper electrode 370 and the lower electrode 330. The lower the drive voltage value is, the higher the oscillation angle sensitivity is.

As can be seen in FIG. 4, the smaller the average grain sizes of the piezoelectric thin films 340 and 360 are, the lower the drive voltage required for the mirror 40 to oscillate at a constant angle is. In other words, the smaller the average grain sizes of the piezoelectric thin films 340 and 360 are, the higher the oscillation angle sensitivity is.

For example, by reducing the average grain sizes of the piezoelectric thin films 340 and 360 from 600 nm to 450 nm, the drive voltage required for the mirror 40 to oscillate at a constant angle can be reduced by approximately 8%.

The reason the oscillation angle sensitivity can be improved is that by reducing the average grain sizes of the piezoelectric thin films 340 and 360, a gap between the crystal grains can be reduced, thereby reducing the loss of power applied to the piezoelectric thin films 340 and 360. That is, the larger the gap between the grains, the higher the current flowing along a creepage surface is, but the smaller the gap between the grains is, the smaller the current flowing along the creepage is. Thus, more current flows inside the piezoelectric thin films 340 and 360, thereby improving the oscillation angle sensitivity. Here, the current flowing along the creepage surface does not contribute to deformation of the piezoelectric actuator.

Additionally, when the same power is applied, the piezoelectric actuator moves well when the crystal grain size is smaller, so that an apparent piezoelectric constant can be increased. Because the current flowing along the creepage surface is reduced, the dielectric strength of the piezoelectric actuator can be increased.

Figure 6:
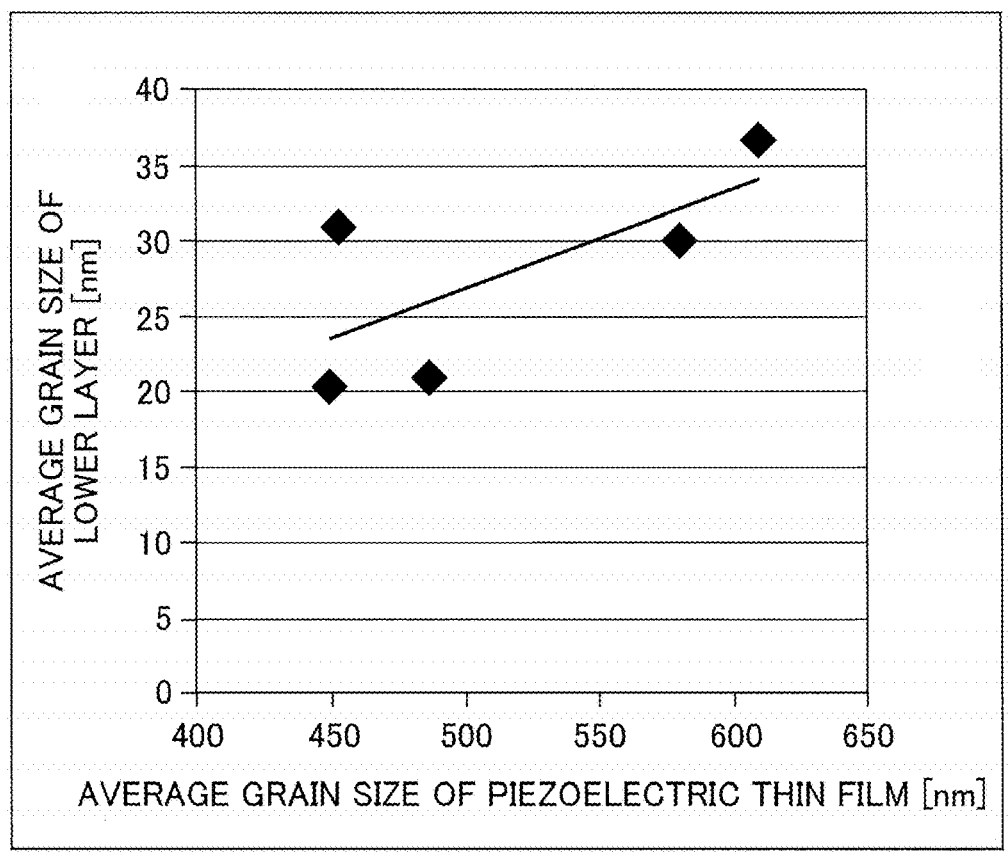
FIG. 6 is a graph illustrating an example of a relation between an average grain size of a piezoelectric thin film and an average grain size of a lower layer.

FIG. 6 is a graph illustrating an example of a relation between the average grain size of the piezoelectric thin film and the average grain size of a lower layer. In FIG. 6, the "average grain size of the lower layer" of the vertical axis is an average value of the crystal grain size in the in-plane horizontal direction of the third layers 333 and 353 obtained by analyzing the cross-sectional photographs of the third layers 333 and 353 with the electron beam diffractor device. As the electron beam diffractor device, in a similar manner of the piezoelectric thin film, the ASTER can be used. The "average grain size of the piezoelectric thin film" of the horizontal axis is similar to the average grain size in FIG. 3.

As can be seen in FIG. 6, the smaller the average grain sizes of the piezoelectric thin films 340 and 360 are, the smaller the average grain sizes of the third layers 333 and 353 are. In order to reduce the average grain sizes of the third layers 333 and 353, the average grain size of a sputtering target used in depositing the third layers 333 and 353 by sputtering may be reduced.

Figure 7:
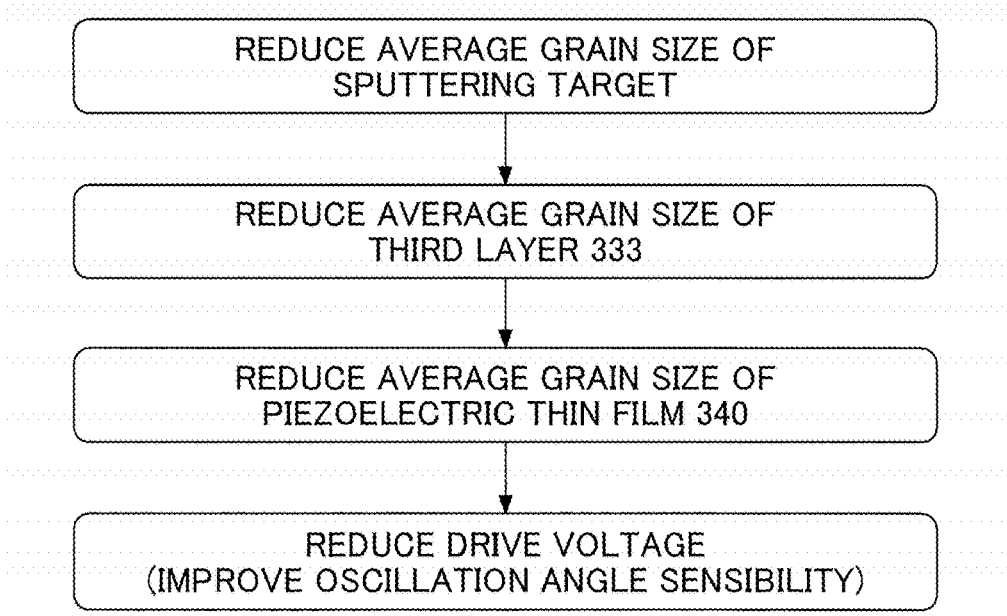
FIG. 7 is a flowchart for describing reduction of drive voltage.

That is, as illustrated in FIG. 7, by reducing the average grain size of the sputtering target of the third layer 333, the average grain size of the third layer 333 is reduced, thereby reducing the average grain size of the piezoelectric thin film 340 formed on the third layer 333. Similarly, by reducing the average grain size of the sputtering target of the third layer 353, the average grain size of the third layer 353 is reduced, thereby reducing the average grain size of the piezoelectric thin film 360 formed on the third layer 353. As a result of the reduction in the average grain sizes of the piezoelectric thin films 340 and 360, the drive voltage can be reduced (the oscillation angle sensitivity can be improved).

Figure 8A:
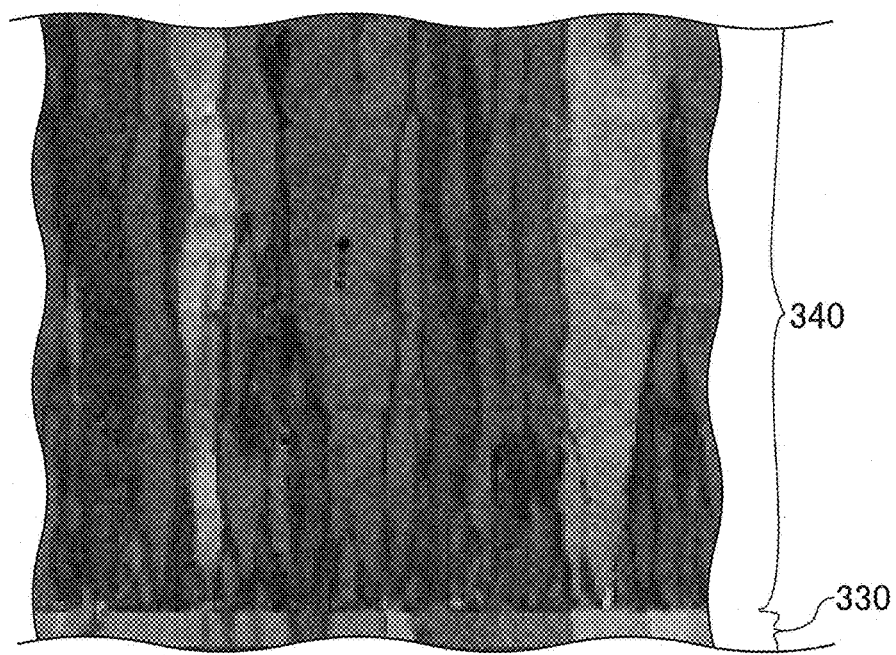
FIG. 8A and FIG. 8B are second cross-sectional photographs of the piezoelectric thin film on the lower electrode.
Figure 8B:
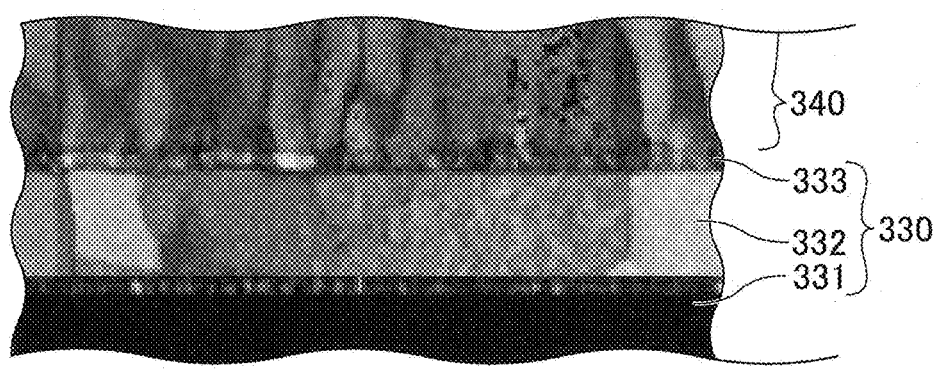

FIG. 8A and FIG. 8B are second cross-sectional photographs of the piezoelectric thin films 340 on the lower electrode 330, and FIG. 8B is an enlarged view near the lower electrode 330 of FIG. 8A.

FIG. 8A and FIG. 8B depict an example in which the average grain size of the third layer 333 constituting the lower electrode 330 is about 30 nm and the average grain size of the piezoelectric thin film 340 is about 579 nm. In this example, the drive voltage at which the oscillation angle of the mirror 40 becomes 3.2 degrees is about 1.85 to 1.95 V (as illustrated in FIG. 4).

Figure 9A:
FIG. 9A and FIG. 9B are third cross-sectional photographs of the piezoelectric thin film on the lower electrode.
Figure 9B:
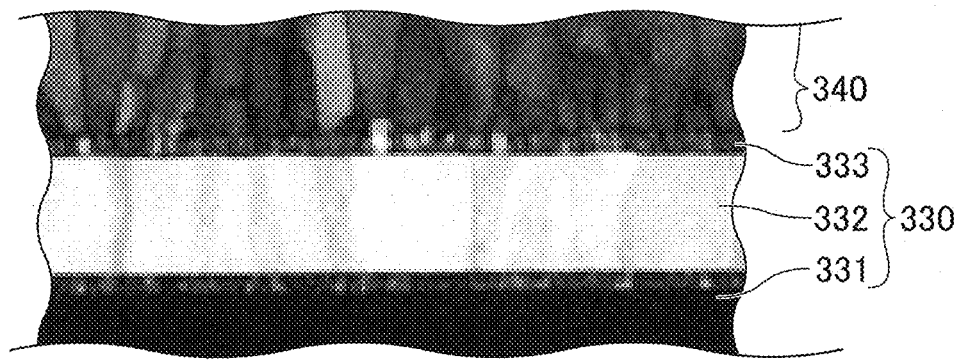

FIG. 9A and FIG. 9B are third cross-sectional photographs of the piezoelectric thin film 340 on the lower electrode 330, and FIG. 9B is an enlarged view near the lower electrode 330 of FIG. 9A.

FIG. 9A and FIG. 9B depict an example in which the average grain size of the third layer 333 constituting the lower electrode 330 is about 20 nm and the average grain size of the piezoelectric thin film 340 is about 449 nm. In this example, the drive voltage that causes the oscillation angle of the mirror 40 to be 3.2 degrees is about 1.7 to 1.8 V (as illustrated in FIG. 4).

As described above, by reducing the average grain size of the piezoelectric thin film, the drive voltage of the piezoelectric actuator can be reduced. In consideration of the drive voltage actually used, the average grain size of the piezoelectric thin film is preferably smaller than or equal to 1 μm, is more preferably smaller than or equal to 600 nm, and is further preferably smaller than or equal to 450 nm. By setting the average grain size of the piezoelectric thin film smaller than or equal to 600 nm, the drive voltage of the piezoelectric actuator can be reduced to 2 V or smaller.

The optical scanning apparatus 1 according to the above-described embodiment can be applied to two-dimensional scanning-type optical scanning apparatuses, such as eyewear and projectors.

In the above-described embodiment, an example of the optical scanning apparatus using a torsion bar is described as the optical scanning apparatus. However, the present invention can also be applied to an optical scanning apparatus that does not use a torsion bar. In the above-described embodiment, although an example of the two-dimensional scanning-type optical scanning apparatus is described, an embodiment is not limited to a two-dimensional scanning-type optical scanning apparatus, but may be a one-dimensional scanning-type optical scanning apparatus that oscillates the mirror in one direction.

The piezoelectric actuator 300 according to the above-described embodiment may be used in an apparatus other than the optical scanning apparatus, for example, as an ink jet head.

Although the specific embodiments have been described, the present invention is not limited to the particulars of the above-described embodiments, and various modifications and substitutions can be made to the embodiments without departing from the scope of the claims.

What is claimed is:

1. A piezoelectric actuator comprising:
a substrate; and
a drive structure formed on the substrate,
wherein the drive structure includes a piezoelectric thin film, and an average grain size of the piezoelectric thin film is 450 nm or greater and 600 nm or less,
wherein the piezoelectric thin film includes a first piezoelectric thin film and a second piezoelectric thin film, and a lower electrode and an intermediate electrode provide drive voltage to the first piezoelectric thin film and the second piezoelectric thin film,
wherein the lower electrode includes a plurality of layers, a lowermost layer and an uppermost layer of the lower electrode among the plurality of layers of the lower electrode are formed of a conductive oxide film, an average grain size of the conductive oxide film of the uppermost layer of the lower electrode is 30 nm or greater and 35 nm or less, and the first piezoelectric thin film is formed on the uppermost layer of the lower electrode, and
wherein the intermediate electrode includes a plurality of layers, a lowermost layer and an uppermost layer of the intermediate electrode among the plurality of layers of the intermediate electrode are formed of a conductive oxide film, an average grain size of the conductive oxide film of the uppermost layer of the intermediate electrode is 30 nm or greater and 35 nm or less, the second piezoelectric thin film is formed on the uppermost layer of the intermediate electrode, and the lowermost layer of the intermediate electrode is formed on the first piezoelectric thin film.

2. The piezoelectric actuator as claimed in claim 1, wherein the piezoelectric thin film has a perovskite structure.

3. The piezoelectric actuator as claimed in claim 1, wherein a piezoelectric material constituting the piezoelectric thin film is lead zirconate titanate, lead niobate zirconate titanate, lead lanthanum zirconate titanate, lead lanthanum titanate, lead magnesium niobate, or lead manganate niobate.

4. The piezoelectric actuator as claimed in claim 1, wherein the conductive oxide film of each of the lowermost layer and the uppermost layer of the lower electrode has a perovskite structure.

5. The piezoelectric actuator as claimed in claim 4, wherein the conductive oxide film of each of the lowermost layer and the uppermost layer of the lower electrode is a lanthanum nickel oxide thin film, a strontium ruthenate thin film, or a barium ruthenate thin film.

6. An optical scanning apparatus comprising:
a mirror; and
the piezoelectric actuator of claim 1 configured to drive the mirror.

7. A piezoelectric actuator comprising:
a substrate; and
a drive structure formed on the substrate,
wherein the drive structure includes a piezoelectric thin film, and an average grain size of the piezoelectric thin film is smaller than or equal to 1 μm,
wherein the piezoelectric thin film includes a first piezoelectric thin film and a second piezoelectric thin film, and a lower electrode and an intermediate electrode provide drive voltage to the first piezoelectric thin film and the second piezoelectric thin film,
wherein the lower electrode includes a plurality of layers, a lowermost layer and an uppermost layer of the lower electrode among the plurality of layers of the lower electrode are formed of a conductive oxide film, an average grain size of the conductive oxide film of the uppermost layer of the lower electrode is 30 nm or greater and 35 nm or less, and the first piezoelectric thin film is formed on the uppermost layer of the lower electrode, and wherein the intermediate electrode includes a plurality of layers, a lowermost layer and an uppermost layer of the intermediate electrode among the plurality of layers of the intermediate electrode are formed of a conductive oxide film, an average grain size of the conductive oxide film of the uppermost layer of the intermediate electrode is 30 nm or greater and 35 nm or less, the second piezoelectric thin film is formed on the uppermost layer of the intermediate electrode, and the lowermost layer of the intermediate electrode is formed on the first piezoelectric thin film.

8. A piezoelectric actuator comprising:

a substrate; and a drive structure formed on the substrate, wherein the drive structure includes a piezoelectric thin film, and an average grain size of the piezoelectric thin film is smaller than or equal to 1 μm, wherein the piezoelectric thin film includes a first piezoelectric thin film and a second piezoelectric thin film, and a lower electrode and an intermediate electrode provide drive voltage to the first piezoelectric thin film and the second piezoelectric thin film, wherein the lower electrode includes a plurality of layers, a lowermost layer and an uppermost layer of the lower electrode among the plurality of layers of the lower electrode are formed of a conductive oxide film having a perovskite structure, an average grain size of the conductive oxide film of the uppermost layer of the lower electrode is 30 nm or greater and 35 nm or less, and the first piezoelectric thin film is formed on the uppermost layer of the lower electrode, and wherein the intermediate electrode includes a plurality of layers, a lowermost layer and an uppermost layer of the intermediate electrode among the plurality of layers of the intermediate electrode are formed of a conductive oxide film having the perovskite structure, an average grain size of the conductive oxide film of the uppermost layer of the intermediate electrode is 30 nm or greater and 35 nm or less, the second piezoelectric thin film is formed on the uppermost layer of the intermediate electrode, and the lowermost layer of the intermediate electrode is formed on the first piezoelectric thin film.

* * * * *